(12) United States Patent
Peter et al.

(10) Patent No.: US 12,180,575 B2
(45) Date of Patent: Dec. 31, 2024

(54) METHOD FOR MANUFACTURING OPTICAL ELEMENTS ACCORDING TO A PRESCRIPTION

(71) Applicant: SATISLOH AG, Baar (CH)

(72) Inventors: Marc Peter, Zurich (CH); Marcel Flemming, Baeretswil (CH)

(73) Assignee: SATISLOH AG, Baar (CH)

( * ) Notice: Subject to any disclaimer, the term of this patent is extended or adjusted under 35 U.S.C. 154(b) by 393 days.

(21) Appl. No.: 17/560,985

(22) Filed: Dec. 23, 2021

(65) Prior Publication Data

US 2022/0119937 A1 Apr. 21, 2022

Related U.S. Application Data

(62) Division of application No. 16/181,951, filed on Nov. 6, 2018, now Pat. No. 11,274,361.

(30) Foreign Application Priority Data

Nov. 7, 2017 (EP) .................................... 17200367

(51) Int. Cl.
  *C23C 14/30* (2006.01)
  *B24B 13/00* (2006.01)
  *B24B 13/005* (2006.01)
  *C23C 14/02* (2006.01)
  (Continued)

(52) U.S. Cl.
  CPC .......... *C23C 14/30* (2013.01); *B24B 13/0018* (2013.01); *B24B 13/005* (2013.01);
  (Continued)

(58) Field of Classification Search
  CPC .............. B24B 13/005; B24B 13/0052; B24B 13/0055; B24B 13/0057; B24B 13/0031;
  (Continued)

(56) References Cited

U.S. PATENT DOCUMENTS

| 2008/0274930 A1 | 11/2008 | Smith |
| 2017/0274490 A1 | 9/2017 | Mechrez et al. |
| 2017/0276568 A1* | 9/2017 | Mechrez .................. B08B 3/12 |

FOREIGN PATENT DOCUMENTS

| CN | 105437019 A * | 3/2016 | ......... B24B 13/0031 |
| DE | 10 2007 060 467 A1 | 6/2009 | |

(Continued)

OTHER PUBLICATIONS

Beat Konrad, "On-block Manufacturing" Jun. 5, 2016 (Year: 2016).*
(Continued)

*Primary Examiner* — Eric J Rosen
*Assistant Examiner* — Robert C Moore
(74) *Attorney, Agent, or Firm* — Oblon, McClelland, Maier & Neustadt, L.L.P.

(57) ABSTRACT

A manufacturing facility for manufacturing an optical element according to a prescription includes a first station configured for surfacing and polishing a second face of a lens blank and pre-cleaning the second face of the lens blank including a finishing drying which allows the lens blank to be put on hold, a second station configured for deep cleaning the second face of the lens blank and hard coating the second face of the lens blank, a tunnel oven configured to degas the lens blank, a vacuum box coater configured to apply an antireflection (AR)-coating, and a third station configured to deblock the processed lens blank from the block piece.

17 Claims, 7 Drawing Sheets

Figure 1:
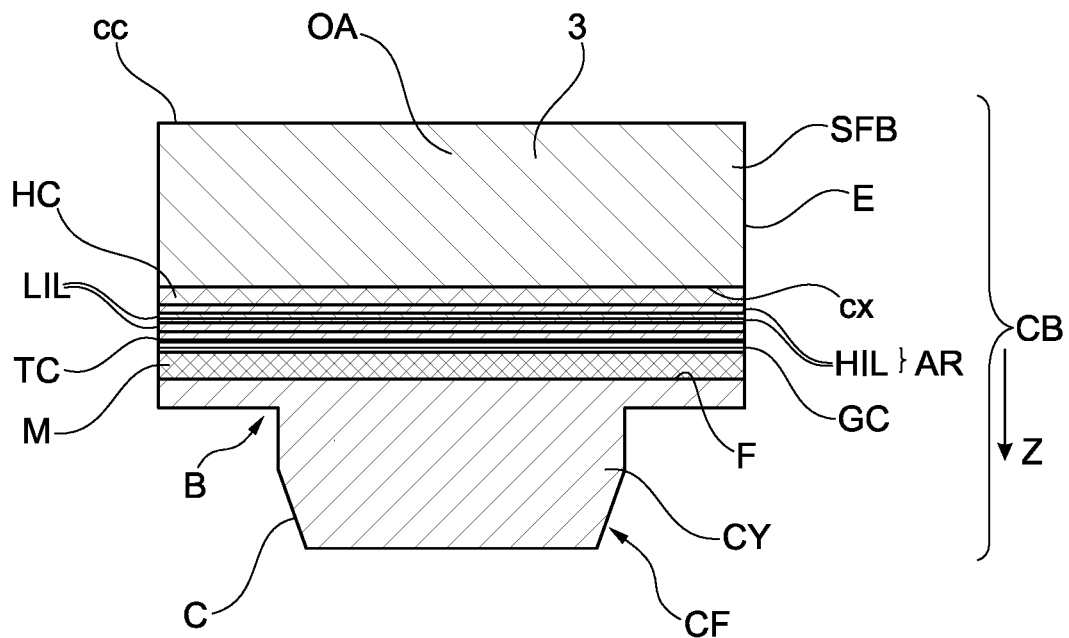

(51) Int. Cl.
    *G02B 1/11* (2015.01)
    *G02B 1/14* (2015.01)
(52) U.S. Cl.
    CPC .............. *C23C 14/021* (2013.01); *G02B 1/11* (2013.01); *G02B 1/14* (2015.01)
(58) Field of Classification Search
    CPC ............ B24B 13/0037; B24B 13/0018; B24B 27/0069; B24B 27/0023; C23C 14/021; C23C 14/30; G02B 1/14; G02B 1/11
    USPC ........................................................ 451/240
    See application file for complete search history.

(56) References Cited

FOREIGN PATENT DOCUMENTS

| JP | 2003-19467 | 1/2003 | | |
|----|----|----|----|----|
| WO | WO 2017/046803 A1 | 3/2017 | | |
| WO | WO-2017199249 A1 | * | 11/2017 | ......... B24B 13/0057 |

OTHER PUBLICATIONS

CN105437019—Machine Translation (Year: 2016).*
Industry Tap—"Conveyor Ovens for Drying Eyeglass Lenses and Sterilizing Surgical Devices" Oct. 24, 2017 https://web.archive.org/web/20171024075945/https://www.industrytap.com/conveyor-ovens-for-drying-eyeglass-lenses-and-sterilizing-surgical-devices/38891 (Year: 2017).*
Extended European Search Report with Written Opinion issued May 8, 2018 in European application 17200367.5, filed on Nov. 7, 2017.
Konrad, B. "On-block Manufacturing, Back side processing advantages," Satisloh Photonics AG, www.satisloh.com/fileadmin/contents/Whitepaper/On-Block-Manufacturing_EN.pdf, 2016, pp. 23.
Machine Translation of DE 102007060467 A1 (Year:2009).
European Office Action issued Sep. 19, 2022 in European Patent Application No. 18 796 059.6, 4 pages.

* cited by examiner

METHOD FOR MANUFACTURING OPTICAL ELEMENTS ACCORDING TO A PRESCRIPTION

This application is a divisional Application of U.S. application Ser. No. 16/181,951, filed Nov. 6, 2018, which claims priority to European Application No. 17200367.5, filed Nov. 7, 2017. The entire contents of the above-identified applications are incorporated herein by reference.

FIELD OF THE INVENTION

The invention relates to a method for manufacturing optical elements like spectacle lenses according to a prescription.

BACKGROUND AND PRIOR ART

When a user has been prescribed spectacle lenses with a new correction by an eye care professional, he usually selects a spectacle frame and associated spectacle lenses and wants to get his new eyeglasses if possible overnight.

However, manufacturing of optical elements like spectacle lenses has become more and more complex and the user has also a large amount of choices for example for the coatings applied to the lenses giving additional functions to the spectacle lenses.

Indeed, after grinding and polishing operations in order to shape the spectacle lenses to get the prescribed optical correction power of the optical element, specific treatments may be applied to the lenses according to the wishes of the user in order to enhance for example the vision comfort of the user and to protect the spectacle lenses against aggressions like for example scratches, dust and soiling materials.

Therefore, after grinding and polishing, several coatings are generally applied to the spectacle lenses like for example a hard coat, anti-reflective coatings or coatings with anti-soiling properties.

Indeed, most of nowadays manufactured spectacle lenses have an anti-reflective coating on both sides of their faces which provide to users an enhanced visual comfort, less fatigue and beautify the appearance of the user. In addition, anti-reflective coating increases the contrast resulting in a better sight of the user in particular when car driving.

Such anti-reflective coating is generally carried out in a coating station known in the state of the art as "box coater".

The execution of such an antireflection treatment involves subjecting optical elements or ophthalmic lens blanks to deposition of a stack of dielectrics under vacuum in an enclosure or chamber suitable for this purpose.

However, application of these coatings needs a perfect clean surface of the spectacle lenses. If this is not the case, the coatings applied may show defects and may peel off after a short period of time.

Therefore after polishing and/or grinding of the spectacle lenses, the latter are thoroughly cleaned once before being charged for example in a spin coater for application of a hard coat and a subsequent AR coating.

The applicant has observed that such a thorough cleaning of the optical elements might not be sufficient. Indeed, during polishing, the temperature of the optical elements raises and the polishing agent, which might be chemically active, in particular when exposed to a raised temperature of the optical element, may affect more in depth the surface to be coated later, in particular the longer the optical element stays in contact with the polishing agent.

This problem has also been observed especially when after polishing and/or grinding, the optical elements stay in a waiting loop before further treatment for example in a spin coater.

Therefore one object of the present invention is to improve the cleaning of the optical elements.

Nowadays, during nearly all steps of spectacles manufacturing, a human operator is involved to charge and discharge the optical elements to be processed in the relevant processing stations. The optical elements are charged and discharged between a tray containing a print out of the features of the future spectacle lenses and the processing station like a polishing station, a spin coating station, a box coater etc.

As consequence, although such operators are generally quite well trained, fatigue, stress or inattention may provoke errors in handling the different jobs of spectacle lenses leading to extended processing times or even optical elements to be scrapped.

Another object of the present invention concerns the automation of the whole spectacle manufacturing process. However, automation also implies that lenses may stay in a waiting loop for a certain time, for example for optimizing batches to be treated in a box coater or in case of process jam.

The present invention proposes a method for manufacturing optical elements according to a prescription where cleaning is improved.

To this extent, the present invention proposes a method for manufacturing an optical element according to a prescription comprising the following steps:
  providing a combination of a block piece and a lens blank having a first face and a second face opposite to the first face, the lens blank being blocked with the first face on the block piece,
  surfacing and polishing the second face of the lens blank,
  cleaning the lens blank,
  hard coating the second face of said lens blank,
  degassing the lens blank,
  applying an AR-coating in a vacuum box coater,
  deblocking the processed lens blank from said block piece,
  wherein said cleaning step comprises
  a pre-cleaning step including a finishing drying step allowing the lens blank to be put on hold,
  a deep cleaning step prior to the hard coating step.

Thanks to the pre-cleaning step just after polishing/grinding, the polished optical element may be put on hold without problem for a certain time and even without further protection. In addition, the action of the polishing agent on the optical element is largely limited.

The method for manufacturing spectacle lenses according to a prescription according to the invention may comprise one or several of the following features taken alone or in combination:

According to one aspect, the lens blank is a semi-finished lens blank, the first face of the semi-finished lens blank presenting a hard coat and/or an AR coating.

The pre-cleaning step comprises for example a first washing step carried out with a warm cleaning fluid having a temperature comprised between 30° C.-50° C., preferentially between 45° C. and 50° C.

The cleaning fluid consists for example of warm water free of additive chemical agents.

According to a further aspect, the water presents a hardness comprised between 5-25° d.H., in particular 14-18° d.H.

During the first washing step, a rotating cleaning jet of cleaning fluid and pressured gas may be projected onto the surfaced and polished second face of the lens blank, the combination of the lens blank and the block piece rotating around its center axis during the first washing step.

The pre-cleaning step may further comprise a rinsing step with soft water having a hardness inferior to 3° d.H., in particular equal to 0° d.H. carried out after said first washing step.

The pre-cleaning step may comprise further a subsequent first drying step carried out after the last of the first washing step or the rinsing step.

Said first drying step can comprise projection of a pressurized gas jet on the washed second face of the lens blank, the gas jet being centered with respect to the center axis of the lens blank.

According to a further aspect, after the first washing step and before the first drying step, the combination of the block piece and the lens blank is disposed in a transportation tray and the first drying step is carried out in a drying chamber separate from a washing chamber where the first washing step is carried out.

The pre-cleaned lens blanks may be disposed in a transportation tray and can be put on hold in a waiting position for further treatment, in particular if necessary.

According to another aspect, the deep cleaning step comprises a second washing step with warm cleaning fluid having a temperature comprised between 30° C.-40° C., preferentially 35° C.

The warm cleaning fluid may consist of warm water which is free of additive chemical agents.

During the second washing step, a least a second and a third static cleaning jets of cleaning fluid and pressured gas can be projected respectively onto the surfaced and polished second face of the lens blank and onto the block piece, the lens blank being hold through at least three gripper arms and rotating around its center axis.

The static cleaning jets are for example projected under a pressure comprised between 5-7 bars, in particular 6 bars.

The deep cleaning step can comprise a drying step of the block piece carried out after the second washing step.

The deep cleaning step may further comprise a third washing step with warm deionized water having a temperature comprised between 30° C.-40° C., preferentially 35° C., under high pressure comprised between 150 bars and 200 bars, in particular 180 bars.

During the third washing step, the lens blank can rotate around its center axis and a fourth cleaning jet carrying out a swiveling or a translational movement may be projected towards the second face of the lens blank.

The invention also relates to a manufacturing facility for manufacturing an optical element according to a prescription for carrying out a method according to any preceding claim comprising:
  a first station configured for
    i. surfacing and polishing a second face of a lens blank blocked with its first face opposite to the second face (cc) on a block piece, and
    ii. pre-cleaning said second face of said lens blank including a finishing drying step allowing the lens blank to be put on hold,
  a second station configured for
    iii. deep cleaning the second face of the lens blank blocked with its first face on the block piece,
    iii. hard coating the second face of the lens blank,
    a tunnel oven for degassing the lens blank,
    a vacuum box coater (319) for applying an AR-coating (AR),
    a third station for deblocking the processed lens blank from said block piece for obtaining the optical element.

According to one aspect, the manufacturing facility further comprises a transfer system for conveyance of said combination of a block piece and a lens blank blocked with its first face on the block piece between the processing stations.

The first station comprises for example an automatic charger of said combination of a block piece and a lens blank on a transportation tray.

The transfer system may comprise several second stations and a conveyor loop for supplying said second stations with lens blanks blocked on block pieces to be hard coated.

BRIEF DESCRIPTIONS OF THE DRAWINGS

Figure 2:
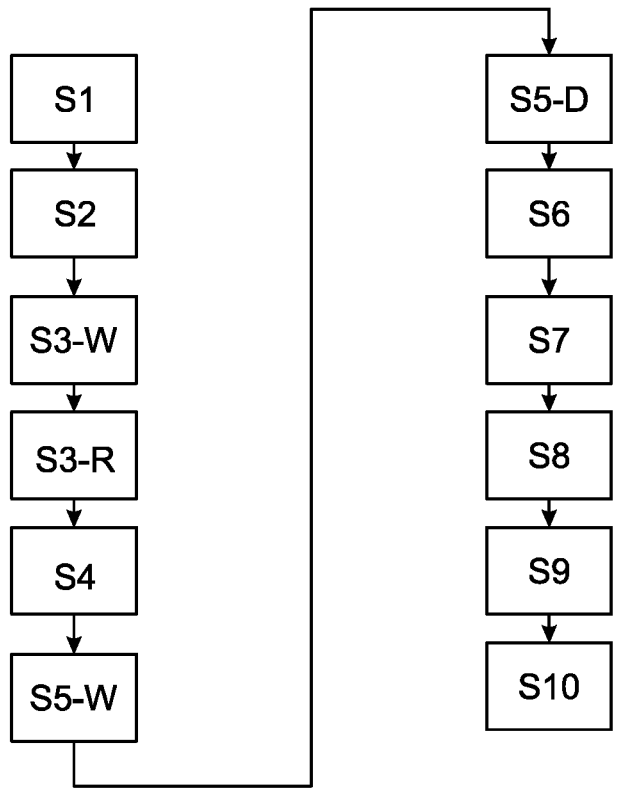
Figure 3:
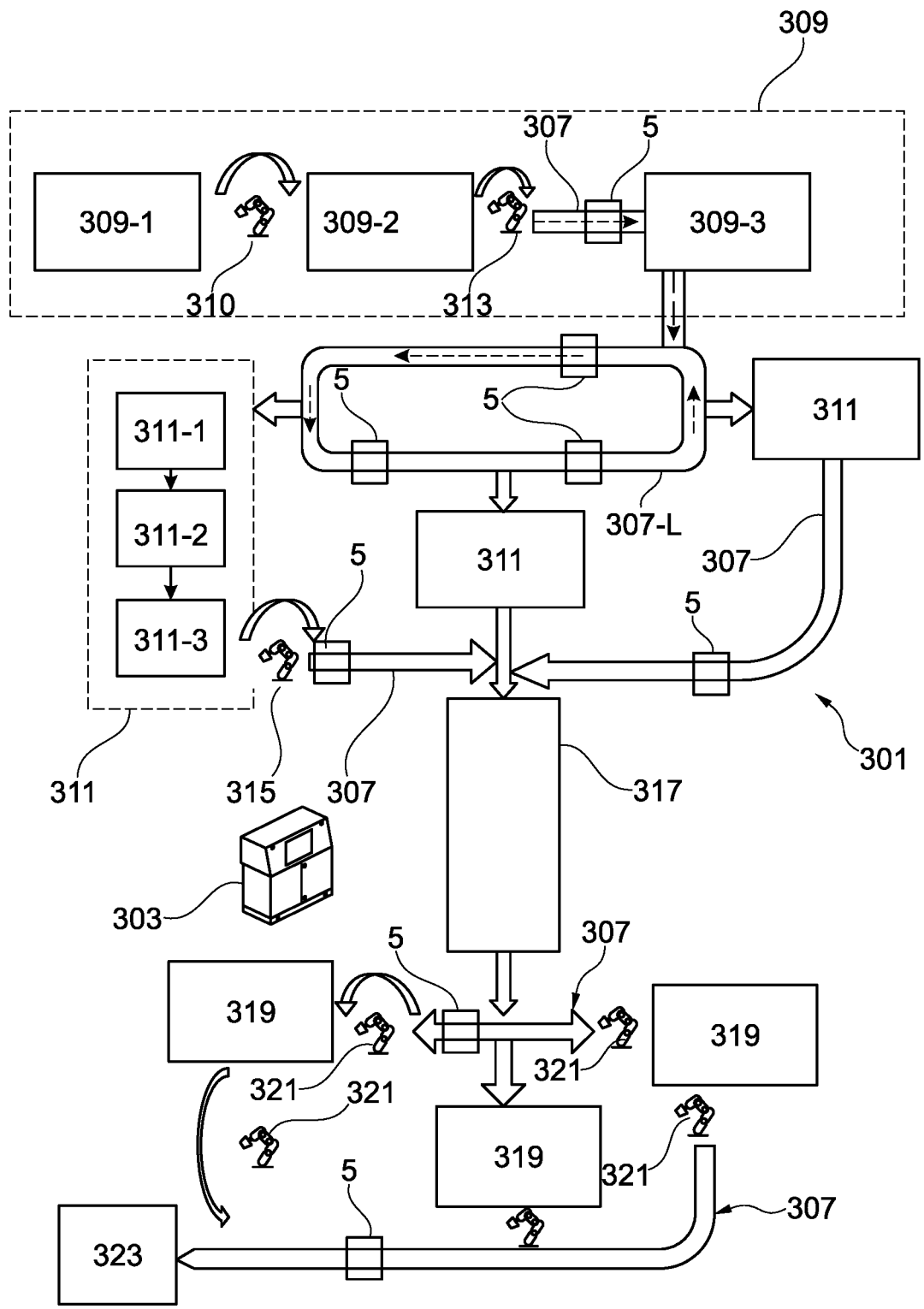
Figure 4:
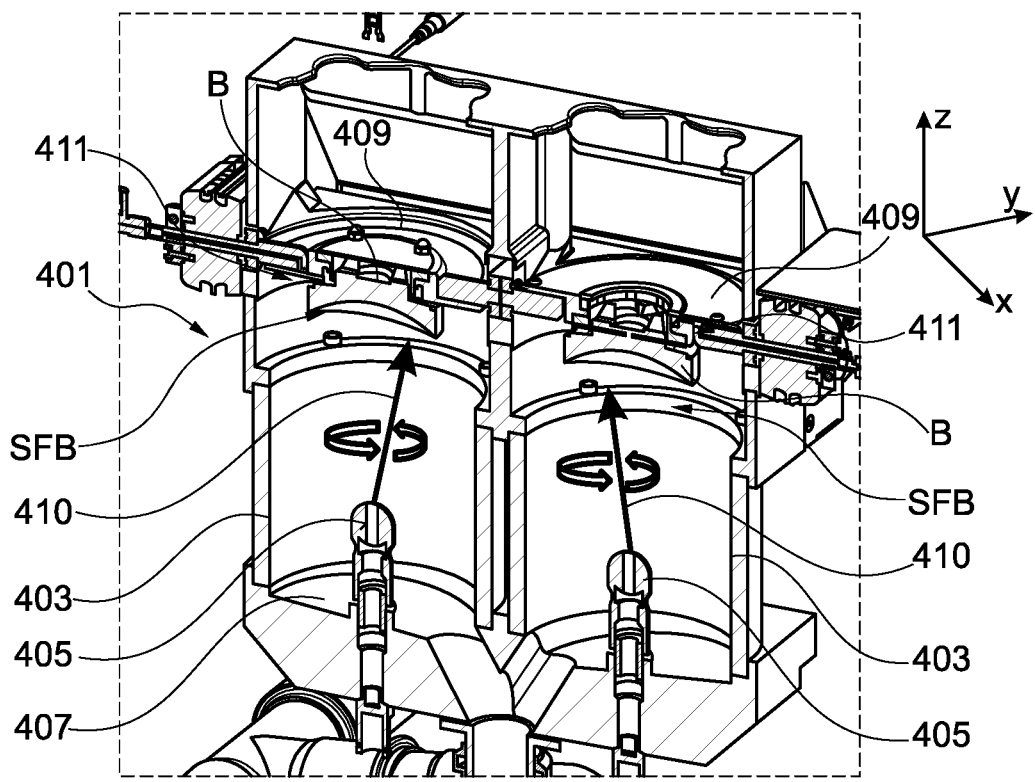
Figure 5:
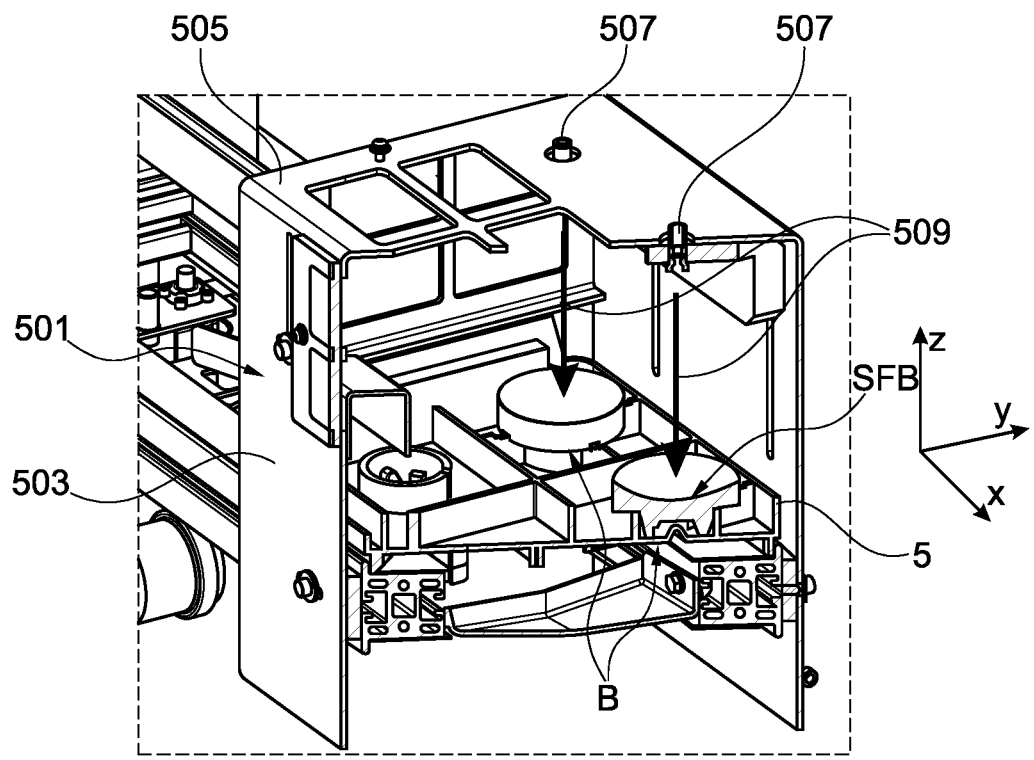
Figure 6:
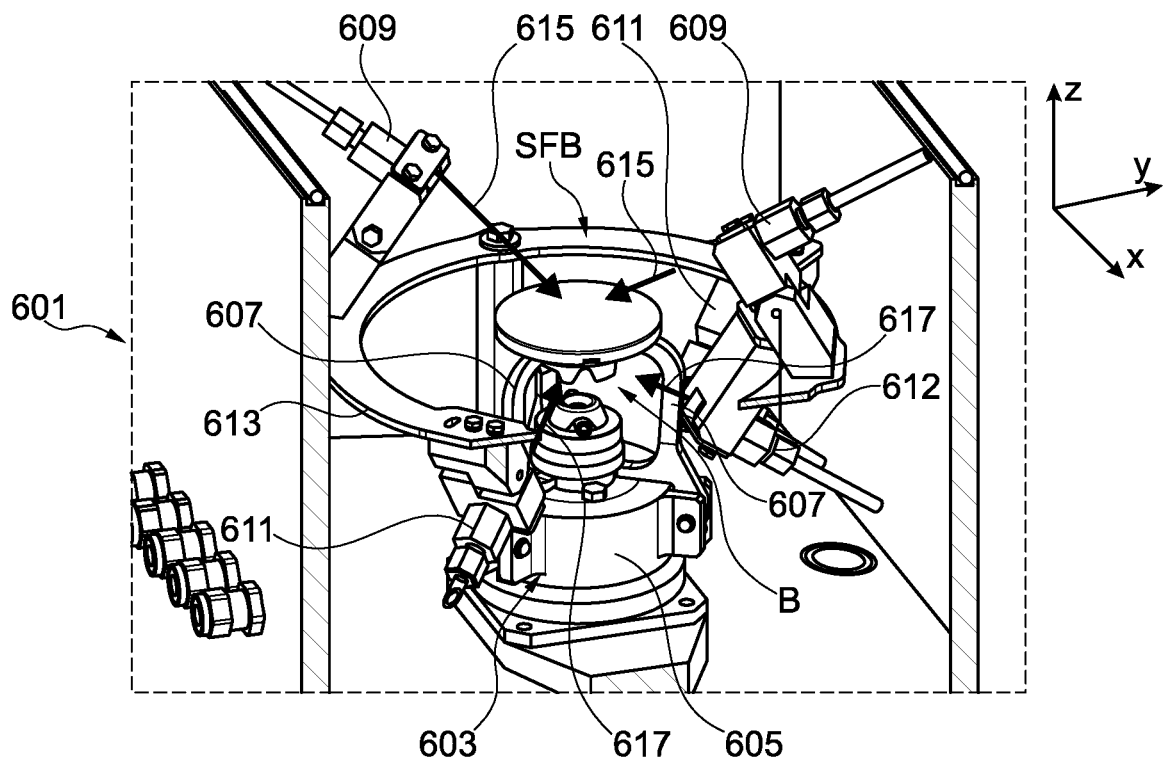
Figure 7B:
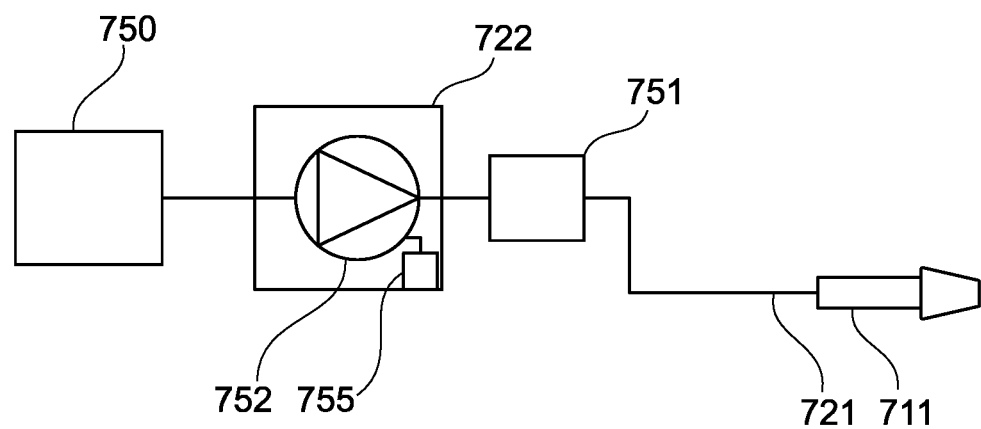
Figure 7A:
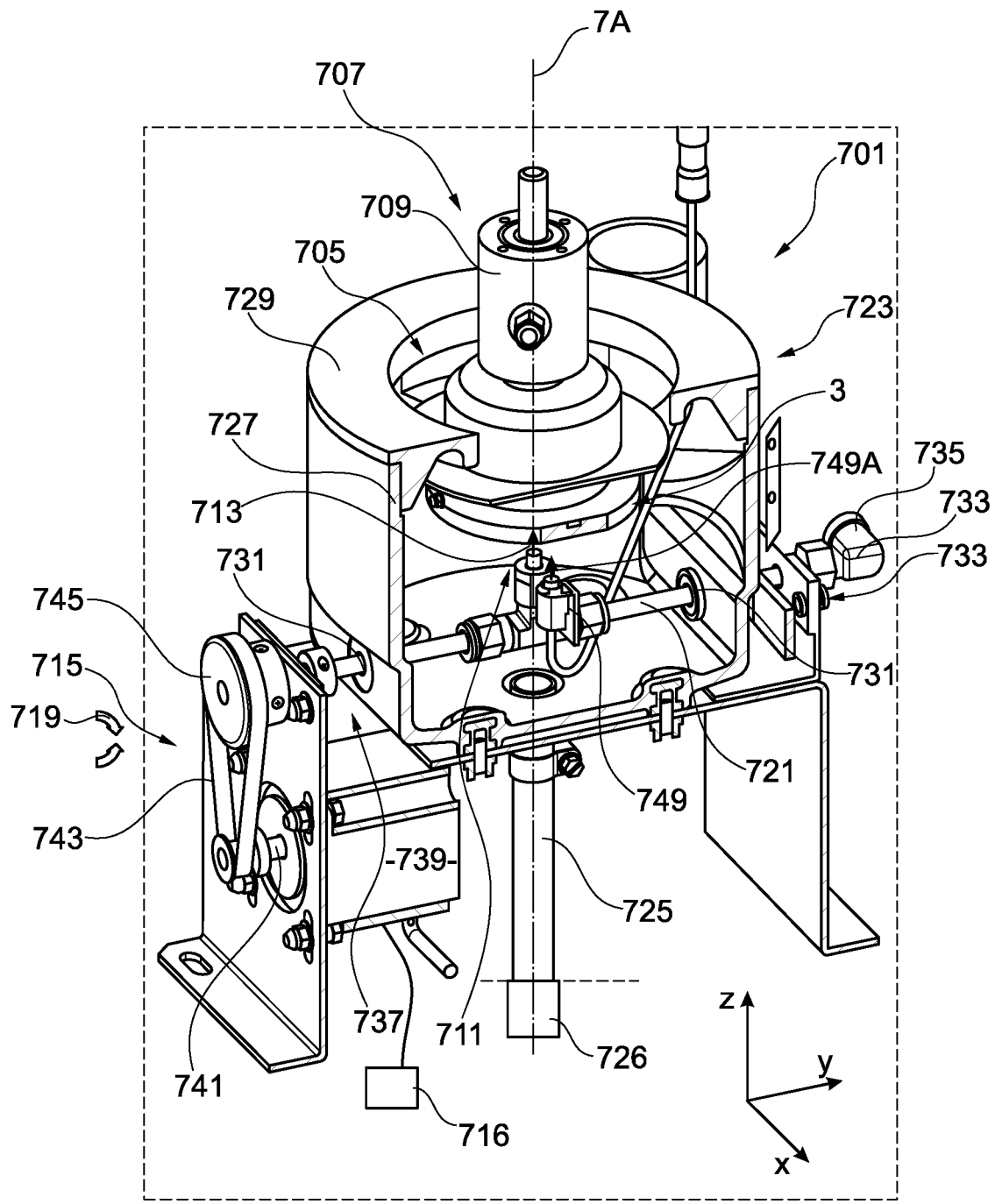
Figure 8:
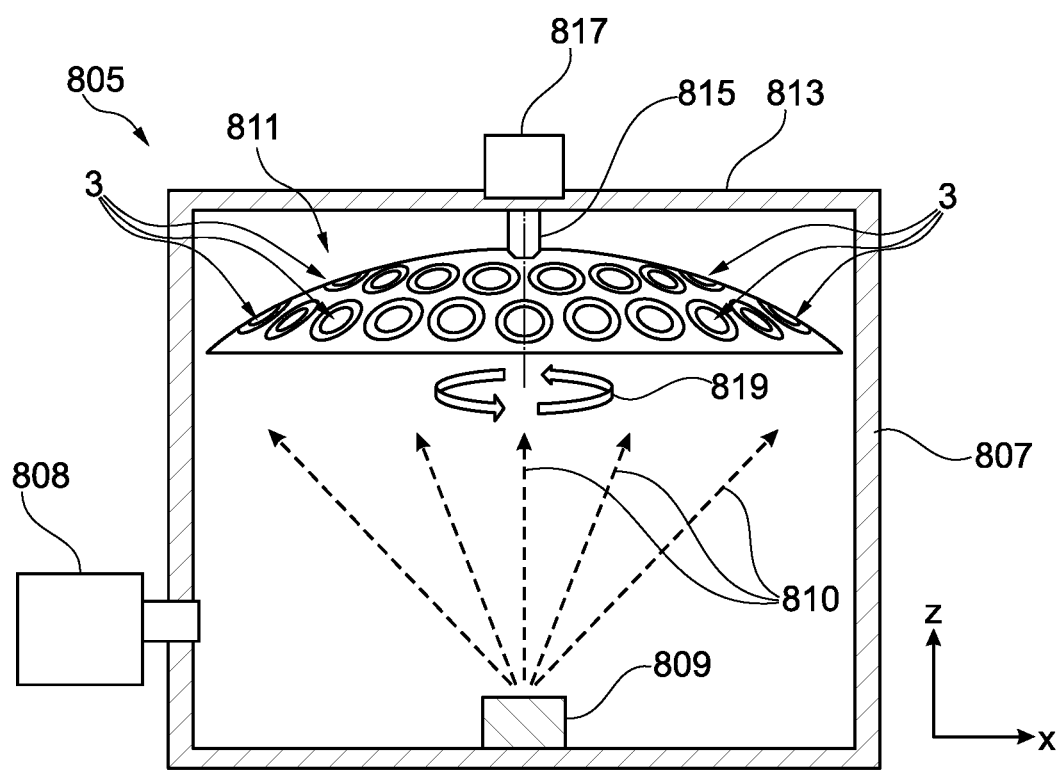
Figure 9:
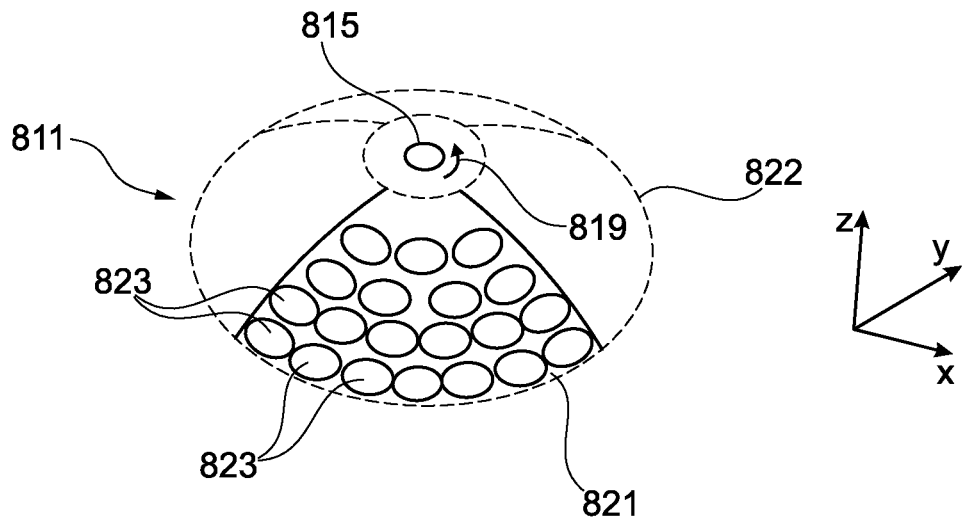
Figure 10:
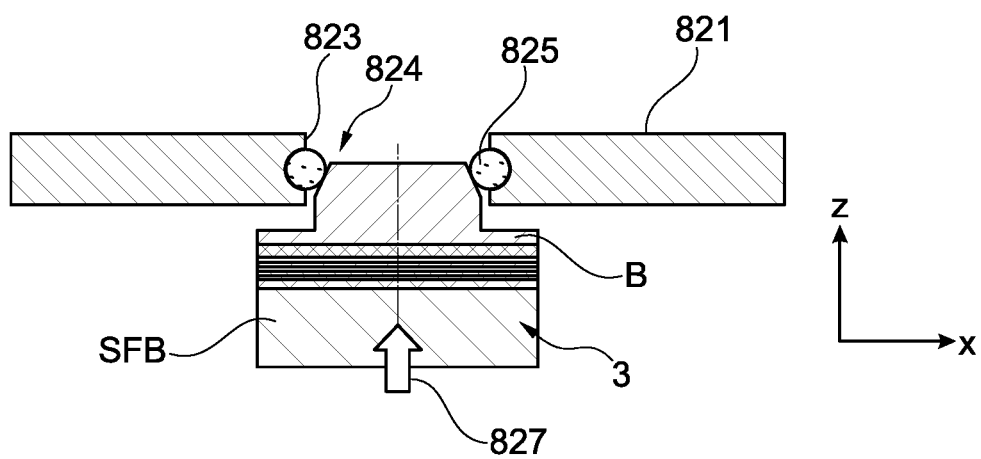

Other advantages and characteristics will appear with the reading of the description of the following figures:

FIG. 1 is a schematic view in cross-section of an optical element fixed on a block piece, FIG. 2 is an embodiment of a flow chart of the method according to the invention, FIG. 3 shows an example of a manufacturing facility according to the invention, FIG. 4 shows an embodiment of a first washing station for carrying out a first washing step after surfacing and polishing, FIG. 5 shows an embodiment of a drying station for drying the lens blanks after the first washing step, FIG. 6 shows an embodiment of a second washing station for carrying out a second washing step, FIG. 7A shows an embodiment of third washing station for carrying out a third washing step, FIG. 7B is a simplified schematic representation of the hydraulic circuit of the third washing station, FIG. 8 shows a schematic cross section of an embodiment of a coating station, FIG. 9 is a schematic view in perspective of an optical elements holder device of the coating station of FIG. 8, FIG. 10 is a schematic view in cross section of a part of a metal sheet carrier of FIG. 8 and an optical element fixed on a block piece.

DETAILED DESCRIPTION

The embodiment(s) in the following description are only to be considered as examples. Although the description refers to one or several embodiments, this does not mean inevitably that every reference concerns the same embodiment, or that the characteristics apply only to a single embodiment. Simple characteristics of various embodiments can be also combined to new embodiments that are not explicitly described.

In the present description, the terms "upstream" and "downstream" are used according the following meaning: a first station for a certain processing operation of an optical element is placed upstream with respect to a second station when the optical element undergoes first the operation in the first station and then another operation in the second station.

And a first station for processing a certain processing operation of an optical element is placed downstream with respect to a second station when the optical element undergoes first the operation in the second station and then another operation in the first station.

By "lens surfacing", it is understood in particular polishing, grinding or fine grinding and the overall object is to yield a finished spectacle lens so that the curvature of the first (in this instance convex) face cx and the curvature of the machined second (in this instance concave) face cc cooperate to yield desired optical properties according to a prescription of the user of the spectacle lenses.

In the figures may be shown a reference triad X-Y-Z, where X and Y are two horizontal axes perpendicular to each other and Z is a vertical axis perpendicular to X and Y.

In the present description, the term "semi-finished lens blank" is used. It is understood that the "semi-finished lens blank" is one of the starting points of the present method and will be transformed throughout different operations to achieve a finished lens blank or simply a finished lens. The term of "semi-finished lens blank" may be used even at the end of the operation in order to be sure to designate always the same object that is transformed through the manufacturing process.

In FIG. 1 is shown an optical element 3 which is for example a lens blank, in particular a semi-finished lens blank SFB which is fixed to a block piece B.

A semi-finished lens blank SFB comprises for example a first face or front face cx, a second face also named back face cc opposite said first face cx, and an edge E between the first face cx and the second face cc.

The first face cx possesses a final curvature (not shown in the drawing) and is already coated, starting from a substrate comprised of, e.g., mineral glass, polycarbonate, PMMA, CR 39, Trivex<®>, HI index, etc., as the case may be, with a standard hard coating HC, a standard antireflection coating AR on top of the hard coating HC, a standard top coating TC on top of the antireflection coating AR, and a special temporary grip coating GC on top of the top coating TC.

As is known per se, the antireflection coating AR comprises for example a stack of alternating antireflection layers of high index HIL and low index LIL with an outermost, in FIG. 1 lowest layer. The top coating TC is selected from a group comprising hydrophobic, oleophobic and dirt repelling coatings, as known.

The thickness of the temporary grip coating GC may range from 1 to 500 nm, preferably from 5 to 100 nm, and more preferably from 10 to 20 nm, in particular 15 nm.

Further, in FIG. 1 reference sign CB designates a combination of the above lens blank SFB and a block piece B for holding the lens blank SFB for processing thereof as will be described here beneath.

As to the structure and function of a currently preferred block piece B explicit reference is being made at this point to document EP 2 093 018 A1 of the present applicant.

Such block piece B, which can be used in thin film coating processes under vacuum conditions, typically has a basic body made from a plastic material, with a workpiece mounting face F for attachment of the lens blank SFB with the aid of a blocking material M on one side, and a clamping portion C on the other side which is configured to be grasped by an elastic blocking means or robotized units (detailed later on in the description) during transport or different processing steps. Clamping portion C has a cylindrical portion CY and a frustoconical shape (truncated cone) CF.

Generally speaking, during lens processing, the lens blank SFB is blocked on the basic body of the block piece B in a machine or apparatus for processing of the lens blank SFB, and to provide in particular for reliable and secure mounting to the processing equipment throughout the whole process while avoiding damage and/or deformation to the lens blank SFB.

As far as a presently preferred blocking material M is concerned, which is applied directly onto the "temporary grip coating GC of the lens blank SFB" or to the mounting face F of the block piece B and preferably comprises an adhesive curable by UV or visible light that is liquid in an un-polymerized state, explicit reference is being made at this point to document EP 2 011 604 A1 of the present applicant. In order to enhance the bonding effect, the workpiece mounting face F of the block piece B may be plasma treated prior to applying the blocking material M onto the workpiece mounting face F.

During manufacturing of spectacle lenses, the second face cc of the lens blank SFB needs to be processed.

However, in alternative embodiments, one may consider that second face cc possesses a final curvature and is already coated. In this case the lens blank SFB is fixed and blocked with its second face cc on the block piece B and the first face cx shall be processed.

In FIG. 2 is illustrated an example of a flowchart of a method for manufacturing an optical element 3 according to a prescription and in FIG. 3 is shown in a schematic way a possible embodiment of a related manufacturing facility 301 configured to carry out such a method.

Hereafter, the method according to the invention is described step by step in following also different processing stations in the manufacturing facility 301.

In a first step S1, there is provided a combination CB of block piece B and the lens blank SFB blocked with its first face cx on the block piece B.

In this case, for example two combinations CB relating to one prescription of one user may be provided in an associated transportation tray 5. The transportation tray 5 as well as the two combinations CB may be identified and associated to specific processing jobs to each of the lens blanks SFB in the management system 303 (see in FIG. 3) which is represents a control system with implemented control functions/software of manufacturing facility 301, the specific processing jobs corresponding the prescription of the spectacle lenses to be manufactured starting from the lens blanks SFB.

Each transportation tray 5 contains in general two lens blanks to be processed and may be specifically identified for example by a tray identification tag or a lens identification tag. Such a tray identification tag or lens identification tag may be a RFID tag or a barcode/matrix code. Different tag readers and/or writers are for example disposed in particular along conveyors 307, 307-L and at the entry and/or exit of a specific processing station. Such identification tags allow localizing and directing the transportation trays 5 within the manufacturing facility 301, as well as monitoring and tracking of the process operations. Thus, the management system 303 is configured to route the transportation trays 5 between the different processing stations and to monitor and track the processing operations.

Furthermore, each identification tag is associated with job data for processing the lens blanks contained in the associated transportation tray 5 in order to obtain final lenses that are in conformity with a prescription and wishes of a user, in particular the prescribed optical correction power and specific treatments applied to the lenses according to the wishes of the user in order to enhance for example the vision comfort of the user and to protect the spectacle lenses against aggressions like for example scratches, dust and soiling materials.

For example, one data matrix code or an RFID tag may be fixed to the transportation tray 5. Or one data matrix code or a RFID tag may be fixed to the clamping portions C of the block pieces B. An RFID tag may be mounted within an internal cavity of the block piece B, which is for example aligned with the optical axis OA. This allows the management system 303 at any time to locate the lens blanks SFB, to know the status of the process operations that have been already realized and that need to be realized, and to convey the lens blanks SFB to the next, if applicable, "available" processing station. At the entry of a specific processing station, a lens blank SFB may be refused if a specific processing operation was not carried out. At the output of a specific processing station, data may be generated and associated with the identification tag or written into such an identification tag (in particular a RFID tag), when a processing operation has been successfully been carried out.

Other identifications means may be employed as well.

Then the combinations CB of block piece B and the lens blank SFB are conveyed to a first station 309 which is a polishing and pre-cleaning station, configured for carry out
- in sub-unit 309-1, a step S2 of surfacing and polishing the second face cc of the lens blank SFB,
- in sub-unit 309-2, a step S3-W of first washing of said second face cc of said lens blank SFB and a step S3-R of rinsing said second face cc of said lens blank SFB, and
- in sub-unit 309-3, a step S4 of drying the washed lens blank SFB.

The transfer between sub-unit 309-1 and 309-2 may be carried out by a robotized unit 310 schematically represented in FIG. 3.

The transfer between sub-unit 309-2 and 309-3 may be carried out by a robotized unit 313 configured to dispose the combination CB of the pre-cleaned lens blank SFB and the block piece B in a tray 5 that is able to travel on conveyor 307 to sub-unit 309-3 as schematically represented in FIG. 3.

The robotized units 310 or 313 may be qualified as automatic chargers/unchargers and comprise for example a gripping arm to grasp the block piece B and to transfer the combination CB of the pre-cleaned lens blank SFB and the block piece B for example in a processing station or out of the latter. This allows that the lens blank SFB is never touched during processing allowing high process safety, process speed and quality.

The polishing and surfacing sub-unit 309-1 will not be described in detail. An example of a possible polishing sub-unit 309-1 is disclosed in WO2013/135331 in the name of the present applicant and is enclosed by reference.

An example of a first washing station in pre-cleaning sub-unit 309-2 which is a first washing station 401, is presented in FIG. 4.

Sub-Unit 309-2=First Washing Station 401

As already stated first washing station 401 corresponds to sub-unit 309-2 and is integrated in the first station 309. In an alternative, the first washing station may also be a stand-alone unit disposed downwards a polishing station.

The washing station 401 comprises two washing containers 403 in order that two combinations CB may be pre-cleaned at the same time, but separately.

Each washing container 403 comprises a rotating projection nozzle 405 disposed on the bottom 407 of the washing container 403 and projecting upwards toward the top.

On the top 409 of the washing container 403 is installed a rotatable holder 411 gripping the block piece B in a manner that the combination CB of lens blank SFB is hanging top down in face of the rotating projection nozzle 405.

During first washing step S3-W, a rotating cleaning jet 410 of a warm cleaning fluid, in particular warm water and pressured gas is projected onto the surfaced and polished second face cc of the lens blank SFB.

The first washing step S3-W is carried out with a warm cleaning fluid having a temperature comprised between 30° C.-50° C., preferentially between 45° C. and 50° C. The warm water is free of additive chemical agents. Warm water has a better washing efficiency. The selected temperature range for the warm water is high enough to get a good washing efficiency and in particular good evacuation of any polish particles and slurry on the second face cc but not too high for causing damages to the first face cx of the lens blank SFB or to the glue for blocking the lens blank SFB on the block piece B.

In order to obtain a good washing efficiency, the water presents a hardness comprised between 5-25° d.H. (d.H.=deutsche Harte=German hardness; 1° d.H.=5.6 mmol/l of alkaline mineral ions), in particular 14-18° d.H.

After this first washing step S3-W, a rinsing step S3-R is realized with soft water having a hardness inferior to 3° d.H., in particular equal to 0° d.H. The soft water is for example at room temperature and needs not to be heated. This rinsing step S3-R is optional and in general shorter than the first washing step S3-W, for example 12-15 s for the first washing step S3-W and about 10 s for the rinsing step S3-R.

Once washed, the top 409 of the washing containers 403 turn around about 180° and robotized unit 313 places the combinations CB of the lens blank SFB and block piece B in an associated transport tray 5 to convey them on conveyor 307 to sub-unit 309-3 which is depicted more in detail in FIG. 5 as drying station 501. In the transportation tray 5, the combination CB of lens blank SFB and block piece B are placed top up, meaning that the block piece B cooperates with the base plate of the transportation tray 5, the second face cc being directed upwards.

Sub-Unit 309-3=Drying Station 501

The drying station 501 (which corresponds to the sub-unit 309-3 when integrated into the first station 309), comprises a drying chamber 503 that is traversed by the conveyor 307.

On the top plate 505 of the drying chamber are installed two jet nozzles 507 for projection of a pressurized gas jet on the washed second face cc of the lens blank SFB. For drying, the transportation tray 5 is stopped in the drying chamber 503 in order that the gas jets are centered with respect to the center axis of the lens blanks SFB. The pressurized gas is for example filtered air according to the international standard ISO 8573-1:2010 [7:8:4] for inert gases and containing particles of less than 40 μm. The applied pressure is between 5-7 bars, in particular 6 bars.

When coming out of the drying station 501, the second face cc of the lens blank SFB is sufficiently cleaned in order that polish agents and slurry are removed and cannot alter anymore the second face cc of the lens blank SFB.

The second face cc is therefore clean enough to be put on hold if necessary, for example in case processes jam occurs or in a waiting position of a transportation system, i.e. for optimizing and grouping several processing jobs.

After this pre-cleaning including the first washing step S3 and the drying step S4, the combination CB of the lens blank SFB and the block piece B is conveyed, disposed in its associated tray 5, to a conveyor loop 307-L.

In addition, in case the transportation tray 5 or the block piece B are equipped with an identification tag, data may be generated and associated with the specific identification tag that the pre-cleaning step has been carried out successfully for the concerned combination CB of the lens blank SFB and the block piece B.

Connected to this conveyor loop 307-L are for example three second stations 311 configured for deep-cleaning the second face of a lens blank SFB blocked with its front side on a block piece B and for hard coating the second face cc.

The second station 311 is for spin coating in order to apply a hard coat on the second face cc of the lens SFB including two upstream located washing stations for deep-cleaning the surface of the second face cc.

In case the transportation tray 5 or the block piece B presented at the entry of the second station 311 are equipped with an identification tag which is not associated with data stating that the pre-cleaning step has been carried out successfully for the concerned combination CB of the lens blank SFB and the block piece B, such transportation tray 5 or combination CB of the lens blank SFB may be refused or sorted out by the management system 303 or the second station 311 itself.

One of the second stations 311 is detailed in FIG. 3 in having three sub-units: sub-unit 311-1 (a second washing station 601), sub-unit 311-2 (a third washing station 701) and sub-unit 311-3 which is a spin coating unit:
Sub-Unit 311-1=a Second Washing Station 601:

The second washing station 601 (sub-unit 311-1) is in particular dedicated to clean the block piece B of the combination CB. This is especially important to ensure that the same block piece B can be used several times. This cleaning step prevents severe accumulation of residual polishing slurry and therefore contamination in downstream vacuum processes.

In the second washing station 601, the combination CB of the lens blank SFB and the block piece B is mounted on a rotational holder 603 having on a rotating base 605 three upwards directed and pivoting gripper arms 607 that enter into contact with the clamping portion C of the block piece B. The pivoting gripper arms 607 are configured to pivot inwards for centering and holding the combination CB in order that the optical axis is aligned with the rotation axis of the rotating base 605.

Several static projection nozzles 609 and 611 are mounted on a support structure 613 having a general circular form with its center aligned with the rotation axis of the rotating base 605. Static projection nozzles 609 are directed from above to the second face cc of the lens blank SFB and static projection nozzles 611 (one of the two nozzles is slightly hidden on the figure) are directed from beneath to the block piece B of the combination CB.

A second washing step S5-W, carried out in the second washing station 601, is realized with a warm cleaning fluid consisting for example of warm water and having a temperature comprised between 30° C.-40° C., preferentially 35° C. which is for example free of additive chemical agents. The cleaning fluid like warm water may contain an alkali soap additive having a PH value comprised between 8-12, in particular equal to 10.9+/−0.8. Such alkali soap additive allows improving adhesion of the subsequent coatings.

Pressurized gas, for example filtered air is added in the water/cleaning jets 615, 617 in order increase its energy and improve the cleaning impact and enhance cleaning efficiency.

During this second washing step S5-W, a least one, but in the present example several second 615 and third 617 static cleanings jet of warm cleaning fluid like warm water and pressured gas are projected respectively by the static projection nozzles 609 and 611 onto the surfaced and polished second face cc of the lens blank SFB and onto the block piece B while the lens blank SFB is hold through at least three gripper arms 607 in contact with the block piece B and rotating around its center axis. The static cleaning jets 615, 617 are projected under a pressure comprised between 5-7 bars, in particular 6 bars.

A static drying nozzle 612 (mounted in front of one of the projection nozzles 611 and hiding the latter) is also mounted on support structure 613. Static drying nozzle 612 is directed, like static projection nozzle 611, from beneath to the block piece B of the combination CB. This ensures the dryness of the block piece B which is necessary before vacuum coating.

Thus, after the second washing step S5-W, a drying step S5-D of the block piece B is realized by projecting pressured drying gas like filtered air through drying nozzle 612 in direction of the rotating combination CB, in particular in direction of the rotating block piece B.

A third washing step S6 is applied and the combination CB of lens blank SFB and block piece B is transferred automatically with a robotized unit (not shown) to sub-unit 311-2 corresponding to the third washing station 701.
Third Washing Station 701=Sub-Unit 311-2

In FIG. 7 is shown an, example of a third washing station 701 comprising an optical element holder 705 for holding the optical element 3 and a first drive 707 for rotating the optical element holder 705 around a rotation axis "7A", the rotation axis "7A" coinciding with the optical axis "OA" of the optical element 3 when held by the optical element holder 705.

The optical element holder 705 is configured to cooperate with the clamping portion C of the block piece B.

The first drive 707 comprises for example a not shown electrical motor. Reference 709 designates the rotational guide for a vacuum suction unit for holding the block piece B and that is coupled via a not shown magnetic coupling to the electrical motor.

In operation, the rotational speed of the optical element is comprised between 1500-2500 revolutions/minute, in particular 2000 RPM.

The third washing station 701 further comprises a cleaning nozzle 711 configured to project a cleaning jet 713 of a cleaning liquid, in particular a cleaning liquid like water towards the optical element 3 and may be disposed beneath the optical element holder 705 (FIG. 7).

Thus, the cleaning jet 713 is projected in a general upward direction along the vertical axis z.

As shown in particular in FIG. 7, the cleaning nozzle 711 is mounted on a second drive 715 for moving the cleaning nozzle 711 in order that the cleaning jet 713 impacts successively different locations on the optical element 3 during cleaning operation.

More specifically, the second drive 715 is connected to a controller unit 716 and is configured to apply a swivel movement (arrows 719 on FIG. 7) to the cleaning nozzle 711. Controller unit 716 comprises for example one or more processors, memories containing a specific program or software and components to communicate in a network allowing for example to receive instructions, in particular job data.

Thanks to the rotational movement of the optical element holder 705 and the back and forth swiveling movement of the cleaning nozzle 711, the cleaning jet 713 impacts successively all locations on the optical element 3 during cleaning operation, developing thus the best cleaning impact. The amplitude and frequency of the swivel movement is controlled by controller unit 716. The swivel movement of the cleaning nozzle is in particular controlled in a way that it moves only to the very circumference of the optical element 3 and does not exceed its circumference. In other words, the swivel movement is depending on the individual geometry of the optical element (like the diameter) and is adjusted automatically for example according to job data related to the optical element 3. This leads to faster processing and enhanced throughput of the third washing station 701.

Typically, projection of the cleaning liquid only starts after start of rotation of the optical element 3 and the start or zero position of the cleaning nozzle 711 is off the center of the optical element 3 in order to avoid damage due to the high pressure cleaning jet 13 which might occur because the center of the optical element 3 can be considered as nearly static.

As an example for application of a swiveling movement to the cleaning nozzle 711, the second drive 15 comprises a swiveling axis 721 orientated perpendicular to the rotation axis "7A" of the optical element holder 705 and the cleaning nozzle 711 is centered with respect to the rotation axis "7A" of the optical element holder 705.

Preferentially, the swiveling axis 721 might be hollow to serve at the same time as feeding pipe for the cleaning liquid.

The optical element holder 705 and the cleaning nozzle 711 are housed in a cleaning chamber 723.

In a bottom part of the cleaning chamber 723 is disposed a suction pipe 725 for aspiration or suction and evacuation of the cleaning liquid after having impacted the optical element 3 for cleaning. To this extent, an exhaust fan 726 is connected to the suction pipe 25. A constant exhaust or suction prevents defects in the hard coat caused by water droplets which can re-deposit on the surface of the optical element 3 if a foggy environment in the cleaning chamber 723 is present.

The cleaning chamber 723 comprises a bottom cylinder 727 supporting the cleaning nozzle 711 and a separable lid 729 supporting the optical element holder 705.

As can be seen on FIG. 1, the swiveling axis 721 traverses the bottom cylinder 727 and is supported by two bearings 731 mounted in the wall of the bottom cylinder 727.

One first end 733 of the swiveling axis 721 comprises a connector 735 for connecting the hollow swiveling axis 721 to a pump unit 722 (FIG. 7B).

The other second end 737 of the swiveling axis 721 is connected to the second drive 715.

In the present case, the second drive 715 comprises an electrical motor 739 connected to and controlled by the controller unit 716. The electrical motor has an output shaft 741 which is connected by a belt 743 to a disk 745 fixed to the second end 737 of the swiveling axis 721.

The third washing station 701 further comprises a separate drying nozzle 749 which is also mounted on the second drive 715 and is configured to project, after cleaning, a drying jet 749A of a drying gas (for example filtered air) towards the optical element 3.

The drying nozzle 749 is for example a tube allowing to limit divergence of the drying jet 749A and having an inner diameter of less than 1 mm to which can be applied pressurized drying gas of about 4-8 bars, in particular 5-6 bars. The pressurized gas is for example filtered air according to the international standard ISO 8573-1:2010 [7:8:4] for inert gases and containing particles of less than 40 μm.

The drying nozzle 749 is coupled and fixed to the cleaning nozzle 711, slightly offset with respect to the latter, and points in a direction parallel to said cleaning nozzle 711.

The second drive 715 is configured for moving the drying nozzle 749 in order that the drying jet 749A impacts successively different locations on the optical element 3 during drying operation.

As for the cleaning, the second drive 715 is configured to apply a swivel movement (arrows 719 on FIG. 7) to the drying nozzle 749.

Thanks to the rotational movement of the optical element holder 705 and the back and forth swiveling movement of the drying nozzle 749, the drying jet 749A impacts successively all locations on the optical element 3 during drying operation, developing thus the best drying impact.

Thus, after the third washing step S6, the optical element 3 can be dried efficiently due to its rotation on the optical element holder 705 and drying jet 749A. The swivel movement of the drying nozzle 749 is in particular controlled in the same way as the cleaning nozzle 711 so that it moves only to the very circumference of the optical element 3 and does not exceed the circumference of the latter. In other words, the swivel movement is depending on the individual geometry of the optical element 3 and is adjusted automatically according to job data related to the optical element 3.

This feature increases the product yield rate because it avoids potential re-deposition of water droplets from the walls of the cleaning chamber 723. Indeed, if the drying jet exceeds the circumference of the optical element 3, it is likely to hit the wet walls of the cleaning chamber 723 and may recontaminate the optical element 3 with cleaning liquid.

The cleaning liquid of the cleaning jet 713 comprises deionized water (DI water) from a deionized water tank 750 (FIG. 7B). A lens drying additive may be added to the deionized water. Such a lens drying additive may be of the family of alcohols.

The third washing station 701 may further comprise a heater 751 installed downstream the pump unit 722 for heating the deionized water, in particular to a temperature comprised between 30° C. and 40° C., for example 35° C.

The pump unit 722 comprises a piston operated pump unit 753, in particular a pneumatic high pressure pump which is equipped with a stroke number monitoring unit 755. Such a stroke number monitoring unit 755 may comprise an induction loop to measure the displacements of the piston in the piston operated pump unit 753.

The working pressure and output of the piston operated pump unit for the cleaning jet is comprised between 150-200 bars, in particular about 180 bars.

The stroke rate of the piston operated pump unit 753 is for example comprised between 100 and 200 strokes/min, in particular 150 strokes/min.

The stroke number monitoring unit 755 counts the number of strokes of the piston operated pump unit 753 in order to detect potential clogging of the cleaning nozzle 711 which would lead to high product rejection rates. This feature is especially helpful when running a fully automated manufacturing of optical elements 3. Once the number of strokes is out of a defined range (for example +/−15% of a reference value), the third washing station 701 will stop processing and an operator will be prompted to maintain or change the cleaning nozzle 711.

One understands that the here disclosed third washing station 701 allows a very efficient cleaning of optical elements 3 in order to prepare the surface of the optical element 3 to be hard coated.

As an example, the whole cleaning and drying cycle lasts only about 20-30 s.

The optical elements 3 are then auto-loaded in particular when the optical element holder 705 is equipped with clamping means for cooperation with clamping portion C of the block piece B.

Then the combination CB of lens blank SFB and block piece B is transferred to sub-unit 311-3 which is a spin coating unit and where a spin coating step S7 for application of a hard coat is applied and cured on the second face cc of the lens blank SFB.

After spin-coating in sub-unit 311-3, the coated lens blank SFB with the block piece B are transferred with a robotized unit 315 on a transportation tray 5 in order to be conveyed to a tunnel oven 317 for application of a degassing step S8. The transportation tray 5 used may be a new one and in this case the management system 303 of the manufacturing facility 301 will associate the transportation tray 5 to the combinations CB of lens blank SFB and block piece disposed in the transportation tray 5.

After the tunnel oven 317 and degassing step S8, the blanks SFB blocked on block piece B are transferred to a vacuum box coater 319 for application of an anti-reflection coating (AR-coating) in step S9.

In FIG. 3, three vacuum box coaters 319 are represented. The management system 303 of the manufacturing facility 301 is configured in order to group lens blanks SFB that need the same AR-coating.

To this extend, the transportation trays 5 are conveyed to a vacuum box coater 319 and uncharged by robotized units 321 which will load automatically sector elements of the vacuum box coaters 319 also designated as coating station with reference to FIGS. 8 to 10.

Coating Station 805 (=Vacuum Box Coater 319)

FIG. 8 shows a cross sectional view of an example of a coating station 805 (vacuum box coater 319 in FIG. 3) for application in particular of an AR coating to the face cc of the lens blank SFB during an AR coating step S9.

The coating station 805 is disposed downstream the degassing tunnel oven 317.

The coating station 805 comprises a vacuum chamber 807 that is connected to a vacuum pump system 808. On the bottom of the vacuum chamber 807 is disposed a vaporization source 809.

During coating, a not shown vaporization material is heated, for example by an electric heating device or an electron beam source in order to vaporize or sublimate the vaporization material (schematically shown by arrows 810) that will be deposited on the optical elements 3, in particular the face cc of the lens blank SFB.

The coating station 805 further comprises an optical elements holder device 811 which is hanging from the top wall 813 of the vacuum chamber 807 and is connected, through a rotation axis 815, to a drive motor 817 configured to rotate (arrows 819) the optical elements holder device 811.

Rotation of the optical elements holder device 811 during coating ensures averaging spatial inhomogeneity of the vaporization cone during coating.

As can be seen on FIG. 9, the optical elements holder device 811 comprises one or several metal sheet carrier(s) 821 having a plurality of holes 823, such as circular holes, and presenting the shape of a dome or a part of a dome in order to put all optical elements 3 to the same distance with respect to the vaporization source 809.

In FIG. 9 is shown in dotted lines a dome frame 822 configured to support four different metal sheet carriers 821, only one of them is shown with having holes 823.

As can be seen on FIG. 10, the optical elements 3 are mounted in a releasable manner upside down in the optical elements holder device 811. Thus in FIG. 8, one can see the backside of the block piece B, the lens blank SFB pointing in direction towards the vaporization source 809.

In order to allow easy mounting of the optical elements 3 blocked on the block piece B, an elastic blocking means 824 associated to each hole 823 is fixed to the metal sheet carrier 821.

This can be seen more in detail in FIG. 10 which is a schematic view in cross section of a part of a metal sheet carrier 821 and an optical element 3 fixed on a block piece B.

According to this embodiment, the elastic blocking means 824 comprises an O-ring 825 of elastic material, like i.e. a fluoroelastomer like VITON (registered trademark) by the company DuPont.

A fluoroelastomer as elastic material has the advantage to withstand the vacuum conditions during coating and not to contaminate the coating process.

In order to mount the optical element 3 with its associated block piece B into a hole 823, the robotized unit 321 only has to grasp or to pick up the block piece B on its lateral sides and to insert it by pushing along arrow 827 into the hole 823. The movement to insert the block piece B into the hole 823 is quite simple so that there is no problem for a programmed robotized unit 321 to realize such mounting instead of a human operator.

As the internal diameter of the O-ring 825 is slightly smaller than the largest diameter of the clamping portion C, the O-ring 825 will be radially compressed and will hold the block piece B by friction regularly contacting the block piece B on all the circumference of the hole 823. The O-ring 825 will then clamp the block piece B in a releasable manner and block the block piece B in a centered position such that the lens blank SFB is hold in a predetermined position for coating.

After AR-coating, the nearly finished lens blanks SFB are recharged by a robotized unit 321 in a transportation tray 5 and conveyed to a third station 323 configured to deblock with a water jet the lenses from the block piece B during a deblocking step S10. The thus processed lens blank SFB becomes the optical element 3 having the optical properties and functions according to the prescription and/or order of the end user.

As one may understand, the manufacturing facility 301 for manufacturing an optical element 3 according to a prescription allows a very efficient process that is less time consuming, enhancing the quality and nearly suppresses all possibilities of errors of human operators. In addition, the lens blank is never touched during all the processing steps.

The process time for steps S3-W/-R-S10 may be less than 90 minutes allowing therefore that fully customized internet orders may be processed in about half a day, leaving the other half day for shipping to the customer. A client may therefore be served within 24$h$ once the order has been sent out to the manufacturing laboratory having a manufacturing facility 301 as described above.

LIST OF REFERENCES

SFB—Lens blank, in particular a semi-finished lens blank
B—Block piece
cx—First face (convex)
cc—Second face (concave)
E—Edge
HC—Hard coating
AR—Anti-reflection coating
TC—Top coating
GC—Grip coating
HIL—High index anti-reflection layer
LIL—Low index anti-reflection layer CB—Combination of SFB and B
M—Blocking material
C—Clamping portion
CY—Cylindrical portion
CF—Frustoconical shape
F—Workpiece mounting face
A—Rotation axis
OA—Optical axis
S1—Step of providing a lens blank SFB on a block piece B
S2—Polishing and surfacing step
S3-W—First washing step
S3-R—Rinsing step
S4—Drying step
S5-W—Second washing step
S5-D—Drying step of block piece
S6—Third washing step
S7—Spin coating step
S8—Degassing step
S9—AR coating step
S10—Deblocking step
3—Optical element
5—Transportation tray
301—Manufacturing facility for manufacturing an optical element according to a prescription
303—Management system
307, 307-L—Conveyor
309—First station (polishing and pre-cleaning)
309-1—Sub-unit of first station for surfacing and polishing
309-2—Sub-unit of first station for first washing
309-3—Sub-unit of first station for drying
310—Robotized unit
313—Robotized unit
311—Second stations for deep cleaning and spin coating
311-1—Second washing station
311-2—Third washing station
311-3—Spin coating unit
315—Robotized unit
317—Tunnel oven
319—Vacuum box coater
321—Robotized unit
323—Third station for deblocking
401—Frist washing station (=sub-unit 309-2)
403—Washing container
405—Rotating projection nozzle
407—Bottom of washing container 403
409—Top of washing container 403
410—Rotating cleaning jet
411—Rotatable holder
501—Drying station (=sub-unit 309-3)
503—Drying chamber
505—Top plate
507—Jet nozzle
509—Gas jet
601—Second washing station (=sub-unit 311-1)
603—Rotational holder
605—Rotation base
607—Pivoting gripper arms
609, 611—Static projection nozzles
612—Static drying nozzle
613—Support structure
615—Second static cleaning jet
617—Third static cleaning jet
7-A—Rotation axis
701—Washing station (=sub-unit 311-2)
705—Optical element holder
707—Frist drive
709—Rotational guide
711—Cleaning nozzle
713—Cleaning jet
715—Second drive
716—Controller unit
717—Center of cleaning jet
719—Arrow for swivel movement
721—Swiveling axis
722—Pump unit
723—Cleaning chamber
725—Suction pipe
726—Exhaust fan
727—Bottom cylinder
729—Separable lid
731—Bearing
733—Frist end of swiveling axis
735—Connector
737—Second end of swiveling axis
739—Electrical motor of second drive
741—Output shaft
743—Belt
745—Disk
749—Drying nozzle
749A—Drying jet
750—Water tank
751—Heater
753—Piston operated pump unit
755—Stroke number monitoring unit
805—Coating station (=vacuum box coater 319)
807—Vacuum chamber
808—Vacuum pump system
809—Vaporization source
810—Arrow
811—Optical elements holder device
813—Top wall
815—Rotation axis
817—Drive motor
819—Arrows
821—Metal sheet carrier
822—Dome frame
823—Holes
824—Elastic blocking means
825—O-ring
827—Arrow

The invention claimed is:
1. A manufacturing facility for manufacturing an optical element according to a prescription, comprising:
   a first station configured for
      surfacing and polishing a second face of a lens blank blocked with a first face of the lens blank opposite to the second face on a block piece, and
      pre-cleaning the second face of the lens blank including a finishing drying which allows the lens blank to be put on hold;
   a second station configured for
      deep cleaning, after the pre-cleaning, at the first station, of the second face of the lens blank including the finishing drying, the second face of the lens blank blocked with the first face of the lens blank on the block piece, and
      hard coating the second face of the lens blank;
   a tunnel oven configured to degas the lens blank;
   a vacuum box coater configured to apply an antireflection (AR)-coating; and a third station configured to deblock the processed lens blank from the block piece for obtaining the optical element.

2. The manufacturing facility according to claim 1, further comprising a transfer system configured to convey a combination of the block piece and the lens blank blocked with the first face of the lens blank on the block piece between processing stations.

3. The manufacturing facility according to claim 2, wherein the first station comprises an automatic charger of the combination of the block piece and the lens blank on a transportation tray.

4. The manufacturing facility according to claim 1, wherein the lens blank is a semi-finished lens blank, the first face of the lens blank presenting a hard coat and/or the AR coating.

5. The manufacturing facility according to claim 1, wherein the pre-cleaning at the first station comprises a first washing performed with a warm cleaning fluid having a temperature comprised between 30° C.-50° C.

6. The manufacturing facility according to claim 5, wherein the cleaning fluid consists of warm water free of additive chemical agents.

7. The manufacturing facility according to claim 6, wherein the water presents a hardness comprised between 5-25° d.H.

8. The manufacturing facility according to claim 5, wherein during the first washing, the first station is configured for projecting a rotating cleaning jet of cleaning fluid and pressured gas onto the surfaced and polished second face of the lens blank, the combination of the lens blank and the block piece rotating around a center axis of the lens blank during the first washing.

9. The manufacturing facility according to claim 1, wherein the pre-cleaning at the first station further comprises rinsing with soft water having a hardness less than 3° d.H. performed after a first washing.

10. The manufacturing facility according to claim 1, wherein the pre-cleaning at the first station further comprises a subsequent first drying performed after a last of a first washing or a rinsing.

11. The manufacturing facility according to claim 10, wherein the first drying at the first station comprises projection of a pressurized gas jet on the second face of the lens blank, the gas jet being centered with respect to a center axis of the lens blank.

12. The manufacturing facility according to claim 10, wherein
the first station comprises a drying chamber and a washing chamber, and
after the first washing and before the first drying,
the combination of the block piece and the lens blank is disposed in a transportation tray, and
the first drying is performed in the drying chamber separate from the washing chamber where the first washing is performed.

13. The manufacturing facility according to claim 1, wherein the deep cleaning at the second station comprises a second washing with warm cleaning fluid having a temperature comprised between 30° C.-40° C.

14. The manufacturing facility according to claim 13, wherein during the second washing, the second station is configured for projecting a least a second and a third static cleaning jets of cleaning fluid and pressured gas respectively onto the surfaced and polished second face of the lens blank and onto the block piece, the lens blank being held through at least three gripper arms and rotating around a center axis of the lens blank.

15. The manufacturing facility according to claim 13, wherein the deep cleaning at the second station comprises drying the block piece carried out after the second washing.

16. The manufacturing facility according to claim 13, wherein the deep cleaning at the second station comprises a third washing with warm deionized water having a temperature comprised between 30° C.-40° C. under high pressure comprised between 150 bars and 200 bars.

17. The manufacturing facility according to claim 16, wherein during the third washing at the second station,
the lens blank is rotated around a center axis of the lens blank, and
a fourth cleaning jet performing a swiveling or a translational movement is projected towards the second face of the lens blank.

\* \* \* \* \*